United States Patent [19]
Cohen et al.

[11] Patent Number: 4,462,160
[45] Date of Patent: Jul. 31, 1984

[54] ILLUMINATED LOCKING TAPE MEASURE DEVICE

[75] Inventors: Howard Cohen, Plainview; Edward Pakus, East Northport, both of N.Y.

[73] Assignee: Irwin Measuring Tool Company, Patchogue, N.Y.

[21] Appl. No.: 457,489

[22] Filed: Jan. 12, 1983

[51] Int. Cl.³ .............................................. G01B 3/10
[52] U.S. Cl. ..................................... 33/138; 362/119
[58] Field of Search ................... 33/138; 362/109, 119

[56] References Cited

U.S. PATENT DOCUMENTS

| | | | |
|---|---|---|---|
| 1,276,311 | 8/1918 | Armbruster | 33/138 |
| 2,354,853 | 8/1944 | Dobbs | 362/119 |
| 2,804,538 | 8/1957 | Leone | 362/109 |
| 2,992,487 | 7/1961 | Miller | 362/119 |
| 3,214,836 | 4/1963 | West | 33/138 |
| 3,812,588 | 5/1974 | Bennett | 33/138 |
| 3,942,738 | 3/1976 | Rutty | 33/138 |
| 4,181,959 | 1/1980 | Tateishi | 33/138 |

FOREIGN PATENT DOCUMENTS

| | | | |
|---|---|---|---|
| 645750 | 7/1964 | Belgium | 33/138 |
| 2100307 | 7/1972 | Fed. Rep. of Germany | 33/138 |
| 1446379 | 6/1966 | France | 33/138 |
| 91404 | 4/1968 | France | 33/138 |
| 1194558 | 6/1970 | United Kingdom | 33/138 |
| 1465067 | 2/1977 | United Kingdom | |
| 1523569 | 9/1978 | United Kingdom | |
| 2023290 | 12/1979 | United Kingdom | |

OTHER PUBLICATIONS

Popular Mechanics, Jan. 1949, p. 252.

*Primary Examiner*—Richard R. Stearns
*Attorney, Agent, or Firm*—Pasquale A. Razzano; Curtis, Morris & Safford

[57] ABSTRACT

An illuminated retractable tape measure has a casing which contains a coiled tape rule whose free end extends through an opening in the casing. A lock arrangement locks the tape against automatic retraction into the casing. In the lock arrangement, a locking member is mounted in the casing with an end thereof engageable with the tape to hold the same against a portion of the casing in a locking position. The end of the locking member is moved out of engagement with the tape when an unlocked position is established. A slide actuator pivots the lock member between its locked and unlocked positions. A small lamp or lamps is incorporated in the casing for illuminating the ruling on the tape measure, and the actuator closes a switch when the actuator is moved to its locked position to light the lamp. This feature facilitates reading measurements on the tape measure, especially in adverse lighting conditions.

13 Claims, 10 Drawing Figures

ILLUMINATED LOCKING TAPE MEASURE DEVICE

BACKGROUND OF THE INVENTION

The present invention relates to tape measures and is more particularly directed to tape measures in which a tape rule is automatically retracted into its casing, but has a lock switch to lock the tape rule in an extended position.

Retractable tape rules are well known and highly useful tools in the carpentry and other trades. Devices have been constructed in the past which permit automatic retraction of the tape rule into a casing, under the influence of a spring-powered retraction unit. A variety of different types of lock members have been proposed for automatic tape rules to lock the tape in a selected extended position and to hold it against retraction under the influence of the spring retraction unit or motor.

It is often difficult to read the tape measure, oweing to lack of available ambient light, for example, during early phases of construction of a building. Because electrical work in a building must often wait until carpentry and other construction is well under way, the inside of a building is often too dark to permit a tradesman to read the measurement on the tape rule. Moreover, it is often necessary for carpenters and other tradesmen to work at night or in closed, unlit surroundings where it is difficult or impossible to read the measurement on the tape rule. A flashlight is often used for this purpose, but the tradesman does not always have a free hand available to shine his flashlight on the rule.

It is an object of the present invention to provide an automatically retractable tape rule in which there is incorporated a reliable and durable mechanism for locking the rule in an extended position and at the same time illuminating the scale on the tape rule.

It is another object of the present invention to provide a retractable tape rule which can be locked with one-hand operation in an extended position, and in the same operation is illuminated to facilitate reading the measurement on the tape rule.

It is a further object of this invention to provide an illuminating arrangement for the tape rule which is built into the casing of the tape rule and which can be switched on and off by the same mechanism that locks and releases the tape rule.

In accordance with an aspect of the present invention, a tape rule having a casing including an opening therein through which an extended tape rule may pass, includes a spring motor or the like for automatically retracting the tape rule into the casing as a coil. The tape rule has indicia thereon, e.g. to indicate inches or centimeters. The tape rule is selectively locked in any desired extended position by actuating a lock member. The same is mounted in the casing for movement between first (lock) and second (unlock) positions. In a favorable embodiment, the lock member has a free end located to engage the tape rule against a portion of the casing in the first position thereby to lock the rule against retraction, and a second position spaced from the rule to permit unimpeded retraction thereof. A slide actuator on the front face of the casing is operatively engaged with the lock member, for example, through a pin and cam slot arrangement, for moving the lock member between its first and second positions.

A lighting device, such as an LED, is disposed in the casing to illuminate the indicia on the tape rule. A power supply, such as a disc power cell, is disposed in the interior of the casing to power the LED, and a switch, completing the circuit including the LED and the power cell, closes and opens in response to movement of the slide actuator to its first and second positions, respectively. As a result, when the tape rule is extended, moving the slide actuator to its lock position both locks the tape rule in its extended position and lights the LED to illuminate the face of the tape rule to facilitate reading it. Moving the slide actuator to its unlocked position releases the tape rule and turns off the LED.

The above and other objects, features and advantages of this invention will be apparent in the following detailed description of an illustrative embodiment thereof, which is to be read in connection with the accompanying drawings, wherein.

Figure 1:
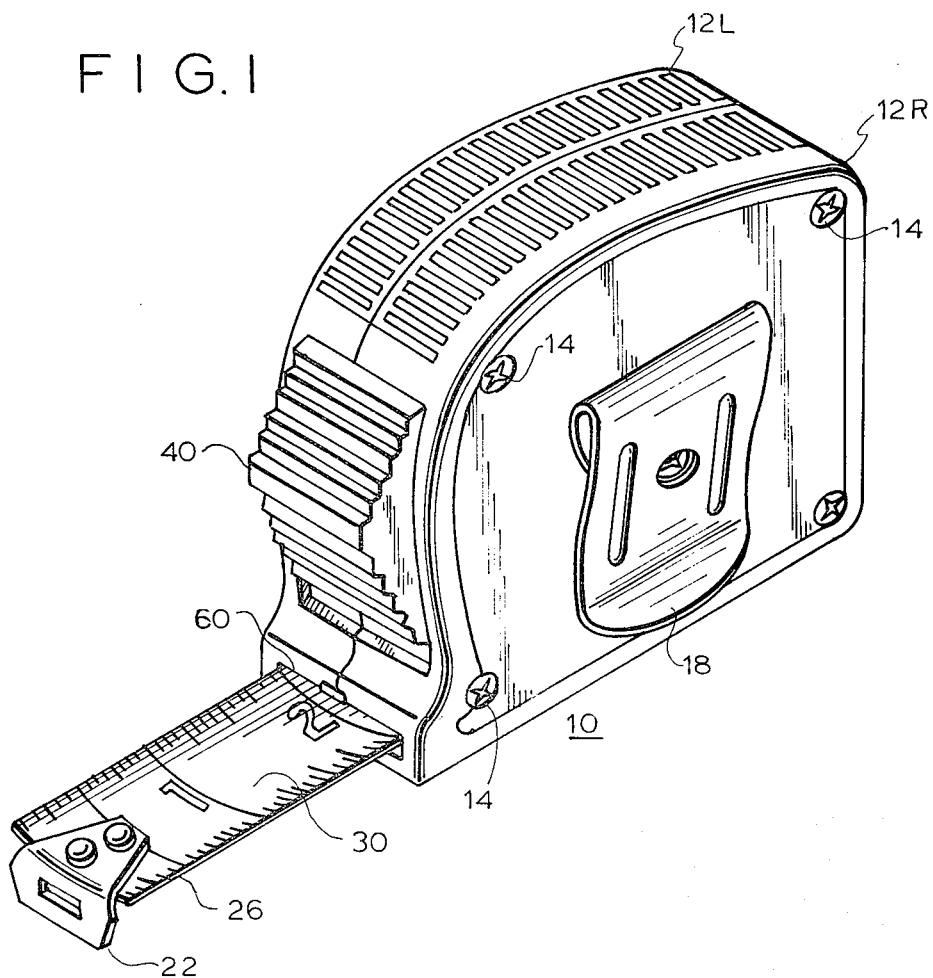
FIG. 1 is a perspective view of an embodiment of a tape measured constructed in accordance with the present invention.

Referring now to the drawings now in detail, FIG. 1 thereof shows a tape measure 10 constructed according to one embodiment of this invention. The tape measure has a casing 12 which may be formed of molded plastic, at least parts of which are conductive, for reasons as stated below. Favorably, the casing 12 is molded in two substantially identical, but mirror-image halves 12L and 12R, corresponding to the left and right halves of the casing 12 when viewed from the front.

Figure 2:
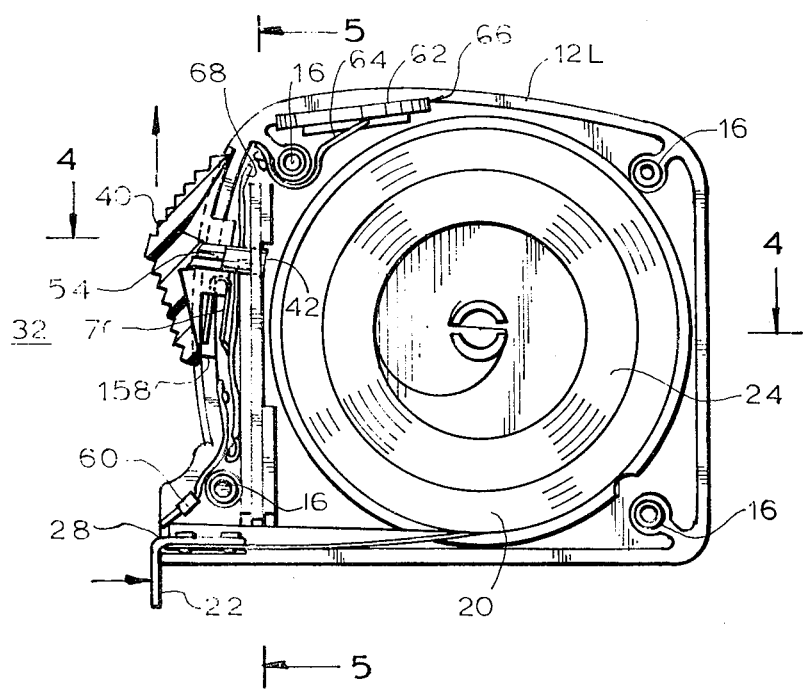
FIG. 2 is a side elevational view, with parts broken away, of the embodiment of FIG. 1 with a locking member thereof in its second, or releasing position.
Figure 3:
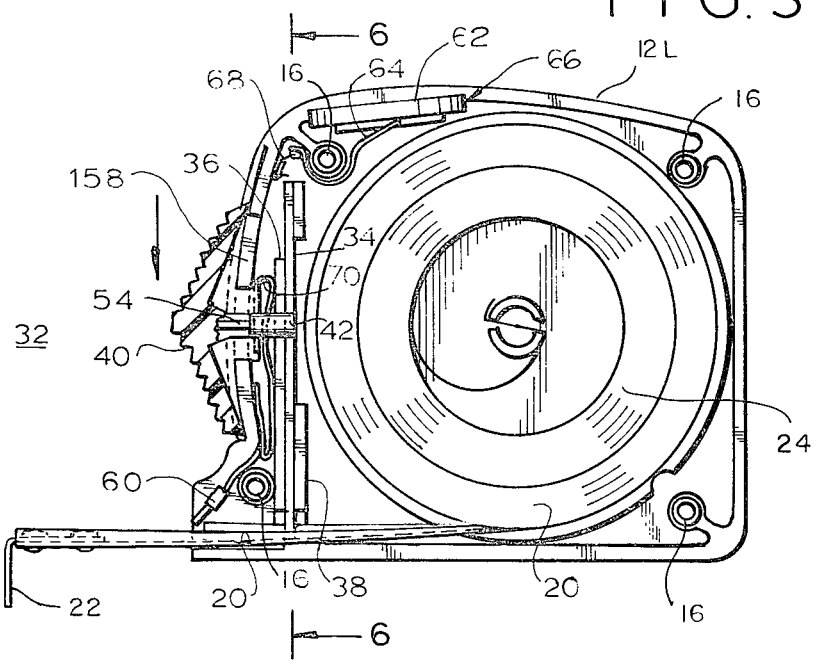
FIG. 3 is a side elevational view similar to FIG. 2 showing the tape extended and its locking member in its first, or locking position.

The casing halves are secured to one another by machine screws 14 inserted in the right casing half 12R and which are received in threaded posts 16 in the interior of the left casing half 12L, as shown in FIGS. 2 and 3.

A belt clip 18 is optionally provided to facilitate carrying the tape measure 10 by a workman.

Figure 4:
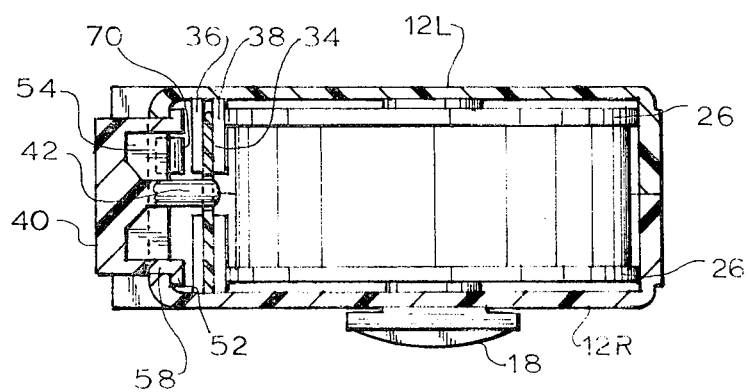
FIG. 4 is a sectional view taken along line 4—4 of FIG. 2, showing the locking member in its second, or releasing position.

As better shown in FIGS. 2-4, a coiled tape rule 20 is disposed within the casing 12, and has a pull member 22 at a free end thereof. A spring-powered retracting motor 24 or the like, of conventional construction, is provided for automatically retracting the tape 20 into the casing 12. Within the casing, the tape 20 is wound on a tape reel 26.

The free end of the tape 20 extends through a crescent-shaped access slot 28 in the front wall of the casing 12. The tape 20 can be extended by gripping the pullout member 22 and pulling the free end of the tape, which can then be locked in position, for example, as shown in FIG. 3.

Indicia or rulings 30 are provided on the tape, in this embodiment to indicate inches. However, corresponding indicia can be used instead to indicate centimeters or other units of measurement.

A suitable locking mechanism 32 for the tape measure 10 is described, for example, in copending patent application Ser. No. 344,199, filed Jan. 29, 1982, and having a common Assignee herewith. However, the same is described briefly here to facilitate an understanding of the present invention.

Figures 5, 6:
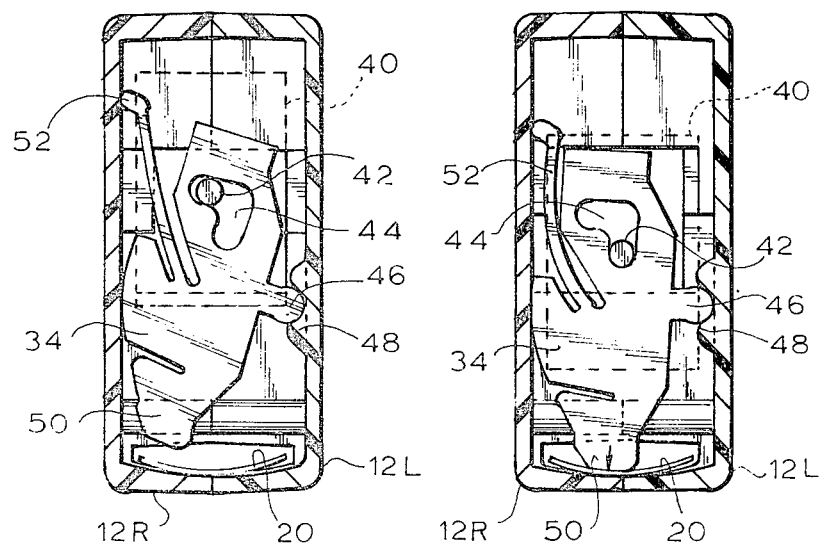
FIG. 5 is a sectional view taken along the line 5—5 of FIG. 2 showing the locking member in its second, or releasing position.
FIG. 6 is a sectional view similar to FIG. 5 but taken along the line 6—6 of FIG. 3 showing the locking member in its first, or locking position.

The locking mechanism 32 of this embodiment includes a multi-sided lock member 34, best shown in FIGS. 5 and 6, and this lock member 34 is disposed between a front plate 36 and back plate 38 which serve as guides for the lock member 34. A slide actuator 40 having a knurled surface to facilitate thumb actuation has a cam post 42 extending into the interior of the casing 12 to interfit an L-shaped slot 44 in the lock member 34.

A pivot protuberance 46 on one side of the lock member 34 fits into a pocket 48 complementary to the protuberance 46 on the left half 12L of the casing. A locking nose 50 is provided on one end of the lock member 34 to press the tape 20 against the casing 12 when the actuator 40, and hence the lock member 34, are urged to a first or lock position thereof (FIGS. 3 and 6), and to be free of the tape 20 when the actuator 40 and the lock member 34 are urged to a second, or unlock position (FIGS. 2 and 5). A spring member 52 is formed in the lock member 34 on the side thereof opposite the protuberance 46, and this spring member is biased against the right half 12R of the casing 12.

Figure 7A:
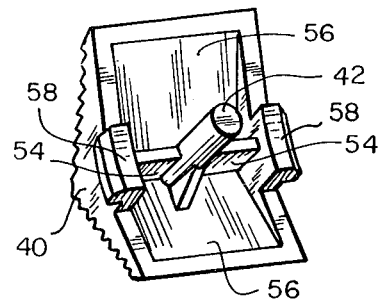
FIGS. 7A and 7B are perspective views illustrating the structure of the slide actuator of the embodiment of this invention.
Figure 7B:
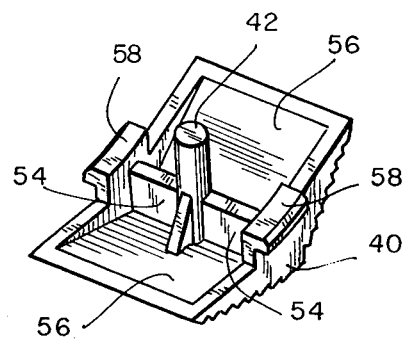

As shown in FIGS. 7A and 7B, the slide actuator 40 also has a medial wall 54 protruding generally inward, i.e., towards the lock member 34 and plate 36, within a recess portion 56 within the actuator 40. Also shown in FIGS. 7A and 7B are outwardly extending ears 58, which each fit under a corresponding slot 158 (FIGS. 2 and 3) in the front wall of the casing 12, to hold the slide actuator 40 in place in the casing 12 while permitting movement of the actuator 40 between its first (lock) and second (unlock) positions.

Figure 8:
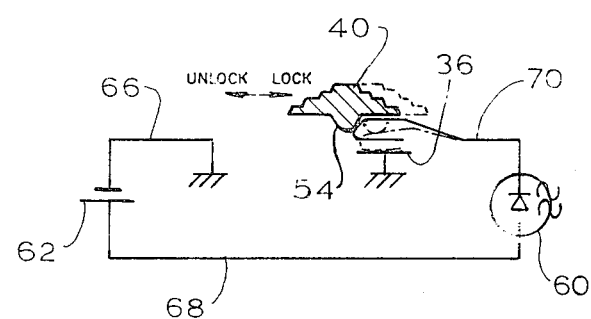
FIG. 8 is a schematic circuit diagram of an illumination circuit of the embodiment of this invention.

The mechanism for illuminating the scale on the tape rule 20 is shown in the electrical diagram of FIG. 8, while the mechanical configuration thereof is illustrated in FIGS. 2 and 3.

A light emitting diode (LED) 60 is disposed at the opening slot 28 centrally on the side thereof facing the indicia 30, as shown in FIG. 1. This LED 60 is preferably of an oblong, flat construction to fit in a corresponding recess in the casing 12 adjacent the slot 28. With its oblong construction, the LED 60 throws a beam of light for substantially the width of the tape 20, but does not interfere with the withdrawal and retraction of the tape 20.

As shown, for example, in FIGS. 2 and 3, a disc power cell 62, for example, a type CR-2430 Li-Mn 3-volt cell, serves as a power source for the LED 60. In this disc cell 62, one flat side thereof serves as a positive electrode, and the reverse flat side thereof serves as the negative electrode. A spring holder and contact 64 is mounted over a non-conducting sleeve S on one of the posts 16, and is biased against one of the surface contacts of the cell 62. A receptacle 66 is cut out of the interior wall of the casing 12, and is in electrical contact with the other flat electrode of the cell 62. Consequently, the negative electrode of the cell 62 is grounded to the casing, as shown symbolically in FIG. 8. A wire 68 connects the spring holder and contact 64 with the anode of the LED 60, and the cathode of the latter is connected to a spring switch 70.

Normally, as shown in FIG. 2, the spring switch 70 is biased by its own resilience out of contact with an adjacent portion of the plate 36 of the locking mechanism 32. However, as shown in FIG. 4, a rounded end of the spring switch 70 lies within the sliding pathway of the medial wall 54 of the slide actuator 40. Thus, so long as the actuator 40 remains in its second, or unlock position (FIG. 2) the spring switch 70 is open, and out of contact with the wall 36. However, if the actuator 40 is moved to its first, or lock position (FIG. 3) the medial wall 54 slides over the curved end of the spring switch 70, and pushes the latter against the plate 36 to ground the switch 70 and close the circuit of FIG. 8, thereby lighting the LED 60.

Preferably, the surface of the tape 20 on which the indicia 30 are printed is coloed a pale yellow green to facilitate reading of measurements and to minimize eye strain. Accordingly, it is preferred that the LED 60 emit a corresponding yellow-green light.

Figure 9:
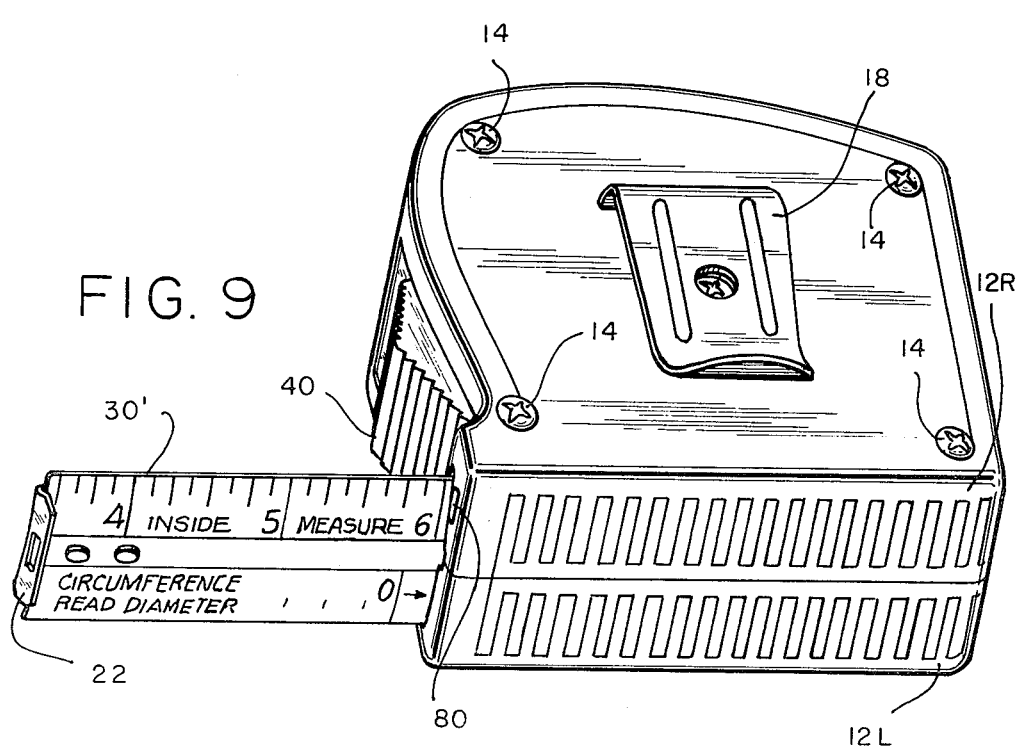
FIG. 9 is a perspective view of a further embodiment of the tape rule constructed in accordance with the present invention.

A further embodiment of this invention is shown in FIG. 9, in which, in addition to the indicia printed on the front face of the tape 20, there can be provided supplemental indicia 30', for example, corresponding to an inside measurement between the pullout member 22 and the far side of the casing 12. In this embodiment, the inside measurement is read at the position of the slot 28. Accordingly, in addition to the LED 60 (hidden in this Figure behind the tape 20) there is provided a supplementary LED 80 which serves to illuminate the supplemental indicia 30' on the back of the tape rule 20. This LED 80 can be powered from the same cell 62, and circuitry can be easily provided, similar to that shown in FIG. 8, to power the LED 80 when the actuator 40 is moved to its lock position.

Moreover, the tape measure can be of the so-called window type, in which measurements are read from the coiled tape through a window in the casing. In that case, the LED 60 or 80 or other suitable lamp device can be disposed at the window, rather than at the slot 28.

Accordingly, it will be seen that a relatively simply constructed tape measure device is provided, which functions to positively lock the tape in its extended position against automatic retraction, and, in addition, provides a built-in illuminating system to permit reading of the tape measure even under extremely adverse lighting conditions.

Although an illustrative embodiment of the present invention has been described herein with reference to the accompanying drawings, it is to be understood that the invention is not limited to those precise embodiments and that various changes and modifications may be effected therein by one skilled in the art without departing from the scope or spirit of this invention.

We claim:

1. In a retractable tape measure including a casing having an opening, a coiled tape rule within said casing having a face with legible indicia thereon and a free end extending through said opening in said casing, means for retracting the tape rule into the casing, and locking means for selectively locking the tape rule in an extended position and releasing the tape rule for retraction into the casing, including an actuator member disposed outside said casing and movable between a unlock position in which said tape rule is released for automatic retraction and a lock position in which said tape rule is locked against retraction; the improvement wherein said tape measure further comprises an electric light device disposed in the casing for illuminating the indicia on said tape rule; power source means within said casing providing electric current to said electric light device; and switch means actuated by said actuator member and connected electrically between said power source and said electric light, to open and close in response to movement of said actuator member to its unlock and lock positions respectively to cause said light to illuminate the indicia on said tape rule when said tape rule is locked in its extended position.

2. A retractable tape measure according to claim 1, wherein said electric light device is an LED having a case of translucent material of oblong cross section, and said casing has a mating recess at said opening such that said LED fits flush in the casing at said opening.

3. A retractable tape measure according to claim 1, wherein said tape rule has a back, opposite said face, with supplemental indicia thereon, and further comprising an additional electric light device disposed at said opening at a side thereof opposite the first-mentioned light device, and also coupled to said power source means and said switch means for illuminating the supplemental indicia on the back of said tape rule when said actuator member is moved to its lock position.

4. A retractable tape measure according to claim 1, wherein said actuator member includes a thumb-actuable slide member having a protuberance thereon facing the interior of said casing, and said switch means include a spring biased against said protuberance, said protuberance urging said switch to close in response to movement to said lock position and permitting the switch to open, under urging of said spring, in response to movement to said unlock position.

5. A retractable tape measure according to claim 4, wherein said face is colored a particular color, and said LED emits light substantially of the same particular color.

6. A tape measure comprising a conductive casing having a tape dispensing opening therein, a tape rule coiled in said casing and having a face with indicia thereon and a free end extending through said tape dispensing opening; means for retracting the tape rule through said opening and winding the retracted tape rule into a coil; locking means for selectively locking said tape in an extended position including a lock member mounted in said casing for movement between first and second positions and having a gripping end to engage said tape rule against a portion of said casing in said first position and to be spaced from said tape rule in said second position; actuator means selectively movable outside said casing to move said lock member between said first and second positions to lock the extended tape rule against retraction and to release the tape rule, respectively; an electric light device disposed to illuminate said indicia on said tape rule and having first and second electrodes; a power source disposed within said casing having one power electrode grounded to said casing and another power electrode coupled to one electrode of said light device; and a switch electrically coupled between said other electrode of said light device and said casing and mechanically actuated by said actuator means to close and energize said light device when in said first position and to open when in said second position.

7. A tape measure as recited in claim 6; wherein said casing includes a conductive plate within said casing and said switch includes a leaf spring pushed against said plate when said actuator means is moved to its first position and released from said plate when said actuator means is moved to its second position.

8. A tape measure as recited in claim 7; wherein said actuator means includes a member slidably mounted on said casing and having a protuberance thereon directed toward said plate, said protuberance engaging said spring to urge it against said plate when the member is moved to the first position and to release the spring from engagement with the plate when the member is moved to its second position.

9. A tape measure as recited in claim 6, wherein said power source includes a disc power cell having flat electrodes on opposite disc surfaces thereof, and said casing includes a receptacle formed in an interior surface thereof such that one flat electrode of said power cell is disposed against said casing and in electrical contact therewith; and a retaining spring biased against the other flat contact of the power cell and in electrical contact therewith and with said electric light device.

10. A tape measure as recited in claim 6; wherein said electric light device includes an LED disposed at said tape dispensing opening on the side thereof at which the face of the tape rule appears.

11. A tape measure as recited in claim 10; wherein said electric light device includes another LED disposed to illuminate other indicia on a back of the tape rule.

12. A tape measure as recited in claim 11; wherein said other LED is disposed at said tape dispensing opening opposite the first-mentioned LED.

13. A tape measure as recited in claim 10; wherein said tape rule is colored a particular color, and said LED emits light substantially of the same particular color.

* * * * *